United States Patent [19]

Nakayama

[11] Patent Number: 5,224,073
[45] Date of Patent: Jun. 29, 1993

[54] REDUNDANT RANDOM ACCESS MEMORY DEVICE EQUIPPED WITH ENCODER COUPLED BETWEEN PROGRAMMING CIRCUITS AND REDUNDANT WORD LINE DRIVING CIRCUITS

[75] Inventor: Hiroshi Nakayama, Tokyo, Japan

[73] Assignee: NEC Corporation, Tokyo, Japan

[21] Appl. No.: 822,758

[22] Filed: Jan. 21, 1992

[30] Foreign Application Priority Data

Jan. 25, 1991 [JP] Japan .................... 3-025504

[51] Int. Cl.$^5$ .......................................... G11C 13/00
[52] U.S. Cl. .................................... 365/200; 365/49
[58] Field of Search ................... 365/49, 200, 210

[56] References Cited

U.S. PATENT DOCUMENTS 5,146,429  9/1992  Kawai et al. ................. 365/200

Primary Examiner—Terrell W. Fears
Attorney, Agent, or Firm—Sughrue, Mion, Zinn, Macpeak & Seas

[57] ABSTRACT

A redundant technology is applied to a semiconductor memory device for rescuing from defect, and comprises a plurality of programming circuits for storing row addresses assigned to defective word lines replaced with redundant word lines, wherein the programming circuits monitor decoded row address signals to see whether or not one of the defective word lines is designated with an external row address signal for supplying enable signals and prohibiting signals to word line driving circuits and redundant word line driving circuits upon matching therebetween, and the enable signals and prohibiting signals are encoded so that the number of signal lines is decreased, thereby making design work easy.

4 Claims, 3 Drawing Sheets

REDUNDANT RANDOM ACCESS MEMORY DEVICE EQUIPPED WITH ENCODER COUPLED BETWEEN PROGRAMMING CIRCUITS AND REDUNDANT WORD LINE DRIVING CIRCUITS

FIELD OF THE INVENTION

This invention relates to a semiconductor memory device and, more particularly, to a redundant technology for rescuing the semiconductor memory device from defect.

DESCRIPTION OF THE RELATED ART

A typical example of the semiconductor memory device with redundancy is shown in FIG. 1 of the drawings, and comprises a plurality of memory cell array blocks 1. Each of the memory cell array blocks 1 is implemented by a plurality of memory cells arranged in rows and columns, and most of the memory cells serve as regular memory cells associated with regular word lines WL. The residual memory cells serve as redundant memory cells, and two pairs of redundant word lines RWL1, RWL2, RWL3 and RWL4 are associated with the rows of the redundant memory cells.

The regular word line groups WL are respectively associated with word line driving circuits 2, and the regular word lines WL of each group are selectively driven by the associated word line driving circuit 2. A word line selector 3 is provided for the word line driving circuits 2, and is operative to select a regular word line from each regular word line group WL.

Two redundant word line driving circuits 4a and 4b are provided for each memory cell array block 1, and the two redundant word line driving circuits 4a and 4b are coupled to the two pairs of redundant word lines RWL1/RWL2 and RWL3/RWL4, respectively. The redundant word line driving circuits 4a and 4b are coupled with the word line selector 3, and the word line selector 3 designates one of the redundant word lines RWL1/RWL2 or RWL3/RWL4 for each redundant word line driving circuit 4a or 4b.

Programming circuits 5 are respectively associated with the memory cell array blocks 1, and each of the programming circuits 5 is coupled through three signal lines S1, S2 and R1 with the redundant word line driving circuits 4a and 4b and the word line driving circuit 2. If defective regular memory cells are found in the associated memory cell array block 1, the row addresses assigned to the regular word lines coupled to the defective regular memory cells are stored in the associated programming circuit 5, and the programming circuit 5 selectively drives the three signal lines S1, S2 and R1. The regular word line coupled with the defective regular memory cell or cells is hereinbelow simply referred to as "defective word line". One of the signal lines S1 and S2 propagates an enable signal to the associated redundant word line driving circuit 4a or 4b upon designation of the defective word line, and the programming circuit 5 simultaneously supplies a prohibiting signal through the signal line R1 to the associated word line driving circuit 2. The prohibiting signal cancels the selection by the selector 3.

Though not shown in FIG. 1, internal row address bits are selectively supplied to the word line selector unit 3 and the word line selector unit 3 supplies decoded row address bits to the word line driving circuits 2 and the programming circuits 5, and the programming circuits 5 monitor the decoded row address bits to see whether or not a defective word line is designated. If any regular word line is not replaced with the redundant word lines RWL1 to RWL4, the decoded row address bits allow each of the word line driving circuits 2 to drive one of the associated word lines WL to an active level. Then, data bits are read out from the regular memory cells to associated bit lines (not shown), and the data bits thus read out to the bit lines are selectively supplied to the outside thereof.

However, if defective word lines are replaced with the redundant word lines RWL1 to RWL4, respectively, the programming circuits 5 monitor the decoded row address bits to see whether or not the row address indicated by the decoded row address bits is matched with any one of the row addresses stored therein. If the row address is not matched with any one of the row addresses, the programming circuits 5 do not produce any enable signal as well as any prohibiting signal, and the selector 3 and the word line driving circuits 2 selectively drive the regular word lines WL. If, on the other hand, the address is matched with any one of the row addresses stored therein, the programming circuit 5 selectively supplies the enable signal to the associated signal line S1 or S2, and the prohibiting signal on the signal line R1 causes the associated word line driving circuit 2 to remain inactive. For this reason, the redundant word lines RWL1 to RWL4 are selectively driven to the active level instead of the defective word lines.

However, a problem is encountered in the prior art semiconductor memory device in that total sum of the signal lines S1, S2 and R1 are too many to freely layout the component circuits and blocks. In detail, since each of the programming circuits 5 requires the three signal lines S1, S2 and R1, the total sum of the signal lines S1, S2 and R1 are increased together with the number of the memory cell array blocks. If all of the programming circuits 5 are arranged to be close to all of the word line driving circuits 2 and all of the redundant word line driving circuits 4a and 4b, the increased signal lines may not be problem. However, other circuits components such as row address decoder units tend to separate the programming circuits 5 from the associated word line driving circuits 2 and the redundant word line driving circuits 4a and 4b, and designers are expected to complicatedly pass the signal lines S1, S2 and R1 through vacant space. This results in a serious barrier to enhance the integration density.

SUMMARY OF THE INVENTION

It is therefore an important object of the present invention to provide a semiconductor memory device which allows programming circuits to couple with driver circuits through a relatively small number of signal lines.

To accomplish the object, the present invention proposes to select a redundant word line driving circuit with a coded signal.

In accordance with the present invention, there is provided a semiconductor memory device fabricated on a single semiconductor chip, comprising: a) a plurality of memory cell array blocks each implemented by a plurality of memory cells arranged in rows and columns, memory cells in first rows selected from the rows serving as regular memory cells, memory cells in second rows selected from the rows serving as redundant memory cells; b) a plurality of regular word line groups respectively associated with the plurality of memory cell array blocks, and each having a plurality of regular word lines respectively associated with the first rows for selectively allowing data bits to be read out from the regular memory cells; c) a plurality of word line driving circuits respectively associated with the plurality of regular word line groups, and selectively driving the plurality of word lines of the associated word line group; d) a plurality of redundant word line groups respectively associated with the plurality of memory cell array blocks, and each having a plurality of redundant word lines respectively associated with the second rows for selectively allowing data bits to be read out from the redundant memory cells, the plurality of redundant word lines of each redundant word line group being respectively replaceable with defective regular word lines which are selected from the plurality of regular word lines of the associated memory cell array block and which are coupled with defective regular memory cells; e) a plurality of redundant word line driving circuit groups respectively associated with the plurality of memory cell array blocks, and each having a plurality of redundant word line driving circuits coupled with the redundant word lines of the associated redundant word line group for selectively allowing data bits from the redundant memory cells; f) a plurality of programming circuits respectively associated with the plurality of memory cell array blocks, and each storing row addresses respectively assigned to the defective regular word lines of the associated memory cell array block, if any, each of the plurality of programming circuits monitoring internal row address bits to see whether or not one of the defective word lines is designated, each of the plurality of programming circuits being operative to produce a multi-bit enable signal indicative of one of the defective word lines indicated by the internal row address bits and a prohibiting signal for canceling enabled state of the word line driving circuit when the internal address bits are indicative of the address assigned to one of the defective word lines; and g) an encoder unit supplied with the multi-bit enable and prohibiting signals from the programming circuits, and operative to produce a coded signal supplied to the plurality of word line driving circuits as well as to the plurality of redundant word line driving circuit groups.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
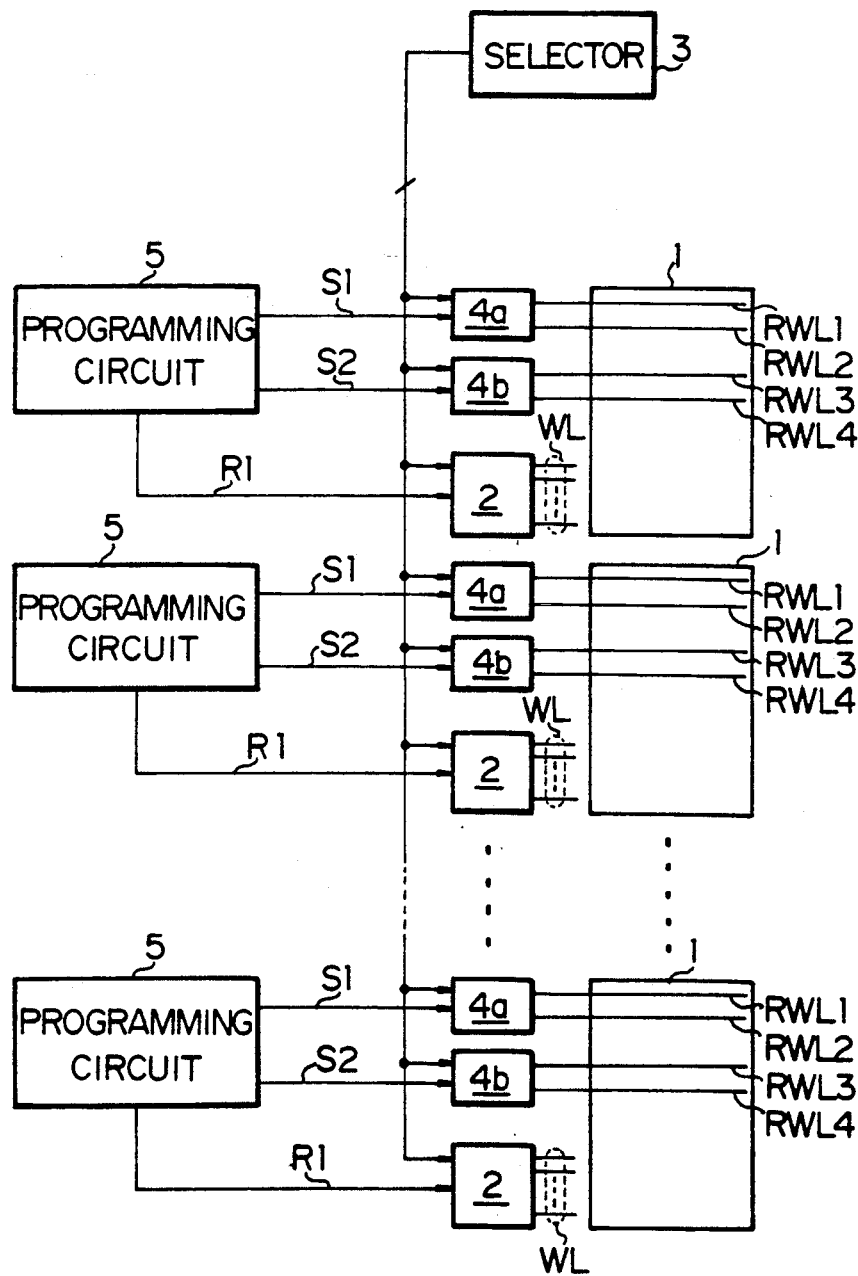
FIG. 1 is a block diagram showing the arrangement of the prior art semiconductor memory device.
Figure 2:
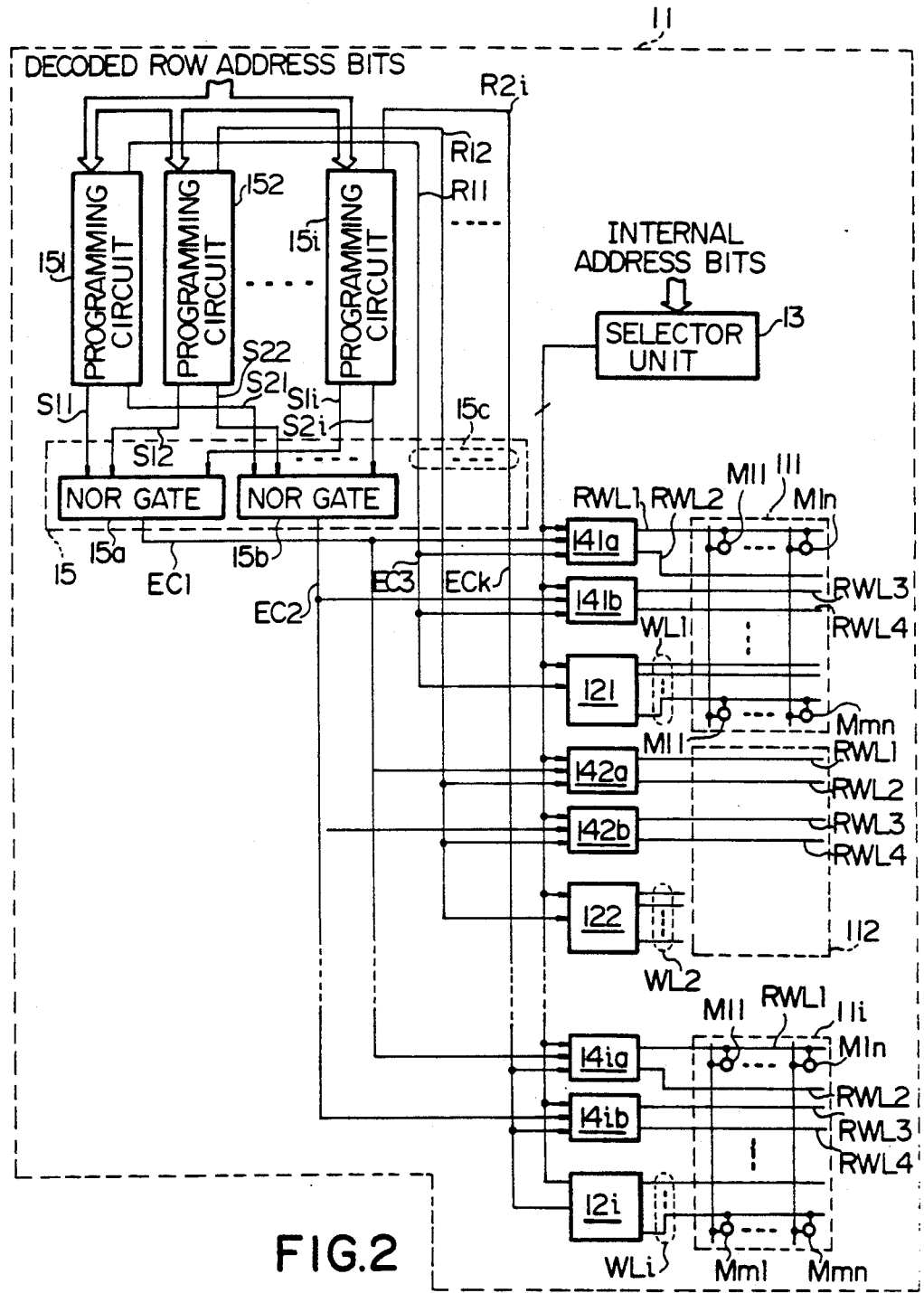
FIG. 2 is a block diagram showing the arrangement of a semiconductor memory device according to the present invention.

Referring to FIG. 2 of the drawings, a semiconductor memory device embodying the present invention is fabricated on a single semiconductor chip 11, and comprises a plurality of memory cell array blocks 111, 112, ... and 11i. Each of the memory cell array blocks 1 is implemented by a plurality of memory cells M11, M1n, Mm1 and Mmn arranged in rows and columns, and first rows of the memory cells in each memory cell array block 111, 112 or 11i serve as regular memory cells associated with regular word lines WL1, WL2 or WLi. The residual memory cells in second rows serve as redundant memory cells, and two pairs of redundant word lines RWL1, RWL2, RWL3 and RWL4 are associated with the second rows of the redundant memory cells of each memory cell array block 111, 112 or 11i.

The regular word line groups WL1, WL2 and WLi are respectively associated with regular word line driving circuits 121, 122 and 12i, and the regular word lines WL of each group WL1, WL2 or WLi are selectively driven by the associated regular word line driving circuit 121, 122 or 12i. A word line selector unit 13 is provided for the word line driving circuits 121, 122 and 12i, and is operative to select a word line from each regular word line group WL1, WL2 or WLi.

Two redundant word line driving circuits 141a and 141b, 142a and 142b, or 14ia and 14ib are provided for each memory cell array block 111, 112 or 11i, and the two redundant word line driving circuits 141a/ 141b, 142a/ 142b or 14ia/14ib are coupled to the two pairs of redundant word lines RWL1/ RWL2 and RWL3/ RWL4, respectively. The redundant word line driving circuits 141a/ 141b, 142a/ 142b and 14ia /14ib are coupled with the word line selector unit 13, and each of the redundant word line driving circuits 141a to 14ib selects a redundant word line from the associated two redundant word lines on the basis of one of the decoded row address bits. An encoder unit 15 is coupled with the all of the redundant word line driving circuits 141a/ 141b, 142a/ 142b and 14ia/ 14ib through only (i+2) signal lines EC1, EC2, EC3 to ECk.

Programming circuits 151, 152 and 15i are respectively associated with the memory cell array blocks 111, 112, and 11i, and the programming circuits 151, 152 and 15i are coupled through signal lines S11 to S1i, S21 to S2i and R11 to R1i with encoder unit 15. If the regular memory cells can not properly store data bits, those regular memory cells are recognized as defective regular memory cells. If the defective memory cells are found in one of the memory cell array blocks 111, 112 or 11i, the row addresses assigned to the defective word lines are stored in the associated programming circuit 151, 152 or 15i, and each of the programming circuits 151, 152 or 15i supplies a multibit enable signal to the associated signal line S11/S21, S12/ S22 or S1i/S2i and a prohibiting signal to the associated signal line R11, R12 or R1i upon consistency of an address indicated by the decoded row address bits with one of the row addresses assigned to the defective word line. One of the component bits of the enable signal is indicative of enabled state for one of the redundant word line driving circuits 141a/141b, 142a/ 142b or 14ia/ 14ib, and the other component bit is indicative of disenabled state of the other associated redundant word line driving circuit. The prohibiting signal is indicative of canceling the enabled state of the associated regular word line driving circuit. For example, if the decoded row address bits are indicative of a defective word line replaced with the redundant word line RWL1 coupled with the redundant word line driving circuit 141a, the associated programming circuit 151 discriminates the decoded row address bits, and causes the multi-bit enable signal to enable the redundant word line driving circuit 141a and to disenable the redundant word line driving circuit 141b. The programming circuit 151 further produces the prohibiting signal, and supplies to the regular word line driving circuit 121. However, the other programming circuits 152 to 15i have no influence on the redundant word line driving circuits 142a, 142b, 14ia and 14ib as well as the regular word line driving circuits 122 to 12i. In this instance, each of the signal lines R11 to R1i is coupled through one of the signal lines EC3 to ECk with not only the associated regular word line driving circuit but also with the associated redundant word line driving circuits. Each of the programming circuits 151 to 15i has an array of fuse elements, and row addresses are memorized by selectively breaking the fuse elements.

The encoder unit 15 comprises a first NOR gate 15a coupled with the signal lines S11, S12 and S1i, a second NOR gate 15b coupled with the signal lines S21, S22 and S2i, and a bundle of signal paths 15c for freely propagating the prohibiting signals. The first NOR gate 15a is coupled with the signal line EC1 which is branched so as to terminate at the redundant word line driving circuits 141a, 142a and 14ia. The second NOR gate is coupled with the signal line EC2 which is also branched so as to terminate at the redundant word line driving circuits 141b, 142b and 14ib. The signal lines EC1 and EC2 and the bundle of the signal lines 15c propagate a code signal to the regular word line driving circuits 121 to 12i and the redundant word line driving circuits 141a to 14ib.

Figure 3:
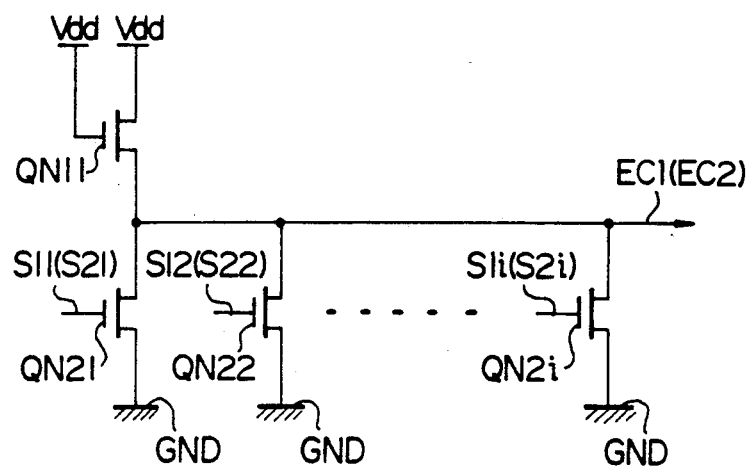
FIG. 3 is a circuit diagram showing the arrangement of an encoder incorporated in the semiconductor memory device shown in FIG. 2.

Each of the NOR gates 15a and 15b is arranged as shown in FIG. 3, and comprises an n-channel enhancement type load transistor QN11 coupled between a source of positive voltage line Vdd and the associated signal line EC1 or EC2, and a parallel combination of n-channel enhancement type switching transistors QN21, QN22 to QN2i coupled in parallel between the asociated signal line EC1 or C2 and a ground voltage line GND. The signal lines S11 to S1i or S21 to S2i are coupled with the gate electrodes of the n-channel enhancement type switching transistors QN21 to QN2i, respectively.

The NOR gate thus arranged behaves as follows. If the components bits on the associated signal lines S11 to S1i or S21 to S2i are in a low level, the NOR gate 15a or 15b allows the associated signal line EC1 or EC2 to remain high. However, if one of the component bits is in a high level, the associated signal line EC1 or EC2 is discharged through one of the n-channel enhancement type switching transistors QN11 to QN1i or QN21 to Qn2i.

If all of the regular memory cells are excellent, any regular word line is not replaced with the redundant word lines RWL1 to RWL4. In this situation, the internal address bits causes the selector unit 13 to designate one of the word line from each of the word line groups WL1, WL2 and WLi. However, the programming circuits 151 to 15i cause the multi-bit enable signals and the prohibiting signals to be inactive, and, for this reason, the decoded row address bits allow the regular word line driving circuits 121 to 12i to selectively drive the associated word lines to an active level. Then, data bits are read out from the regular memory cells coupled to the activated regular word lines to asociated bit lines, respectively.

Assuming now defective regular memory cells are found in the memory cell array block 111 and that the four defective regular word lines are replaced with the redundant word lines RWL1 to RWL4, the row addresses assigned to the defective word lines are stored in the programming circuit 151. If the external row address signal is indicative of the defective word line replaced with the redundant word line RWL1, the programming circuit 151 discriminates the designation by comparing the row address indicted by the decoded row address bits with the row addresses stored therein, and producing the multi-bit enable signal on the signal lines S11 and S21 as well as the prohibiting signal on the signal line R11. The component bit on the signal line S11 is in the active high level, and the other component bit on the signal line S21 remains in low. Then, the NOR gate 15a allows the signal line EC to decay in the low level, and the NOR gate 15b keeps the signal line high. Then, only the redundant word line driving circuit 141a is enabled with the signal line EC1 and the signal line EC3 propagating the prohibiting signal, and drives the redundant word line RWL1 to the active level instead of the defective word line. However, the redundant word line driving circuit 141b remains inactive because of the signal line EC2 of the high level. Since the other programming circuits 152 to 15i do not produce any prohibiting signal, the other redundant word line driving circuits 142a to 14ib do not drive the associated redundant word lines, On the contrary, the defective word line replaced with the redundant word line RWL3 is designated by the decoded row address bits, the programming circuit 151 shifts the signal line S21, and the NOR gate 15b allows the signal line EC2 to go down. Then, the redundant word line driving circuit 141b is enabled, and the other redundant word line driving circuits 141a and 142a to 14ib remain inactive.

As will be understood from the foregoing description, since the semiconductor memory device according to the present invention selectively enable the pair of redundant word line driving circuits with the coded signal, the signal lines EC1 to ECk is decreased rather than those of the prior art semiconductor memory device, and a designer can easily complete the layout of wirings.

Second Embodiment

Figure 4:
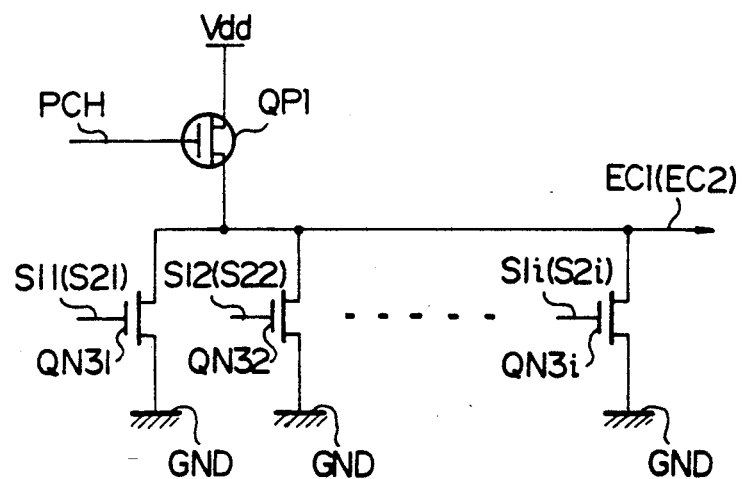
FIG. 4 is a circuit diagram showing the arrangement of an encoder incorporated in another semiconductor memory device according to the present invention.

Turning to FIG. 4 of the drawings, a NOR gate forming a part of an encoder unit is illustrated. The other components of the second embodiment are similar to those of the first embodiment, and no further description is hereinbelow incorporated for the sake of simplicity.

The NOR gate shown in FIG. 4 comprises a p-channel enhancement type precharging transistor QP1 coupled between a source of power voltage line Vdd and one of the signal lines EC1 and EC2, and a plurality of n-channel enhancement type switching transistors coupled in parallel between the signal line EC1 or EC2 and the ground voltage line GND. The p-channel enhancement type precharging transistor QP1 is responsive to a precharging signal PCH, and the precharging signal PCH is decayed to the low level prior to change of the decoded row address bits. The n-channel enhancement type switching transistors are respectively gated by the signal lines S11 to S1i or S21 to S2i. The NOR gate thus arranged achieve the NOR operation on the component bits of the multi-bit enable signals as similar to that of the first embodiment.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a single semiconductor chip, comprising:
   a) a plurality of memory cell array blocks each implemented by a plurality of memory cells arranged in rows and columns, memory cells in first rows selected from said rows serving as regular memory cells, memory cells in second rows selected from said rows serving as redundant memory cells;
   b) a plurality of regular word line groups respectively associated with said plurality of memory cell array blocks, and each having a plurality of regular word lines respectively associated with said first rows for selectively allowing data bits to be read out from said regular memory cells;
   c) a plurality of word line driving circuits respectively associated with said plurality of regular word line groups, and selectively driving said plurality of word lines of said associated word line groups;
   d) a plurality of redundant word line groups respectively associated with said plurality of memory cell array blocks, and each having a plurality of redundant word lines respectively associated with said second rows for selectively allowing data bits to be read out from said redundant memory cells, said plurality of redundant word lines of each redundant word line group being respectively replaceable with defective regular word lines which are selected from said plurality of regular word lines of said associated memory cell array block and which are coupled with defective regular memory cells;
   e) a plurality of redundant word line driving circuit groups respectively associated with said plurality of memory cell array blocks, and each having a plurality of redundant word line driving circuits coupled with said redundant word lines of the associated redundant word line group for selectively allowing data bits from said redundant memory cells;
   f) a plurality of programming circuits respectively associated with said plurality of memory cell array blocks, and each storing row addresses respectively assigned to said defective regular word lines of the associated memory cell array block, if any, each of said plurality of programming circuits monitoring internal row address bits to see whether or not one of said defective word lines is designated, each of said plurality of programming circuits being operative to produce a multi-bit enable signal indicative of one of said defective word lines indicated by said internal row address bits and a prohibiting signal for canceling enabled state of said word line driving circuit when said internal address bits are indicative of said address assigned to one of said defective word lines; and
   g) an encoder unit supplied with said multi-bit enable and prohibiting signals from said programming circuits, and operative to produce a coded signal supplied to said plurality of word line driving circuits as well as to said plurality of redundant word line driving circuit groups.

2. A semiconductor memory device as set froth in claim 1, in which said encoder unit comprises a first NOR gate supplied with component bits each selected from one of said multi-bit enable signals, a second NOR gate supplied with other component bits each selected from one of said multibit enable signals, and signal paths for said prohibiting signal.

3. A semiconductor memory device as set forth in claim 2, in which each of said first and second NOR gates comprises a load transistor coupled between a source of power voltage level and an output node thereof, and a plurality of switching transistors coupled in parallel between said output node and another source of power voltage level and gated by the component bits supplied from said plurality of programming circuits.

4. A semiconductor memory device as set forth in claim 2, in which each of said first and second NOR gates comprises a precharging transistor coupled between a source of power voltage level and an output node thereof and responsive to a precharging signal, and a plurality of switching transistors coupled in parallel between said output node and another source of power voltage level and gated by the component bits supplied from said plurality of programming circuits.

* * * * *